United States Patent
Liou et al.

(10) Patent No.: US 8,773,186 B1
(45) Date of Patent: Jul. 8, 2014

(54) DUTY CYCLE CORRECTION CIRCUIT

(71) Applicant: Elite Semiconductor Memory Technology Inc., Hsinchu (TW)

(72) Inventors: Jian-Sing Liou, Kaohsiung (TW); Shu-Han Nien, Xihu Township, Changhua County (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 0 days.

(21) Appl. No.: 13/957,004

(22) Filed: Aug. 1, 2013

(51) Int. Cl.
*H03K 3/017* (2006.01)

(52) U.S. Cl.
CPC ........................ *H03K 3/017* (2013.01)
USPC .......................... 327/175; 327/172

(58) Field of Classification Search
USPC ................................. 327/172–175
See application file for complete search history.

(56) References Cited

U.S. PATENT DOCUMENTS

| | | | |
|---|---|---|---|
| 6,441,600 B1 * | 8/2002 | Atallah et al. | 324/76.11 |
| 7,015,739 B2 * | 3/2006 | Lee et al. | 327/175 |
| 8,106,697 B2 * | 1/2012 | Chang et al. | 327/175 |
| 2005/0122149 A1 * | 6/2005 | Cho et al. | 327/175 |

* cited by examiner

*Primary Examiner* — Lincoln Donovan
*Assistant Examiner* — Thomas Skibinski
(74) *Attorney, Agent, or Firm* — Juan Carlos A. Marquez; Morris, Manning & Martin, LLP

(57) ABSTRACT

A duty cycle correction circuit comprises a duty cycle detector, a filter, a comparator, a SAR DAC, an equalization device, a pass gate circuit, and a duty cycle corrector. The duty cycle detector generates control signals in response to internal clock signals. The equalization device equalizes voltage levels of the control signals, and the pass gate circuit applies the control signals to the duty cycle corrector. The filter obtains average voltages of the control signals. The comparator compares output signals from the filter to generate a comparison result. The SAR DAC performs a SAR algorithm to generate analog output signals based on the comparison result. The duty cycle corrector receives external clock signals, the analog output signals, and output signals from the pass gate circuit to generate the internal clock signals with a corrected duty cycle.

14 Claims, 10 Drawing Sheets

DUTY CYCLE CORRECTION CIRCUIT

BACKGROUND OF THE INVENTION

1. Field of the Invention

The present invention relates to a circuit for providing a corrected duty cycle.

2. Description of the Related Art

Generally, a delay locked loop (DLL) is used in a synchronous semiconductor memory device, such as a double data rate synchronous dynamic random access memory (DDR SDRAM), to perform synchronization between an internal clock signal and an external clock signal of the synchronous semiconductor memory device. When the external clock signal is inputted to the synchronous semiconductor memory device, a time delay occurs due to a clock skew between the external clock signal and the internal clock signal. Therefore, the DLL is employed in the synchronous semiconductor memory device for generating the internal clock signal by compensating for the clock skew.

The DDR SDRAM inputs and/or outputs data at rising and falling edges of the clock signal so as to increase the transmission speed of data. As the operational speed of the DDR SDRAM is increased, performance of the DDR SDRAM is greatly affected by performance of the DLL. Therefore, since design margin decreases with an increase of duty error, having a correct duty cycle of the internal clock is important. Reliable data transmission is achieved when the duty cycle is equivalent to 50%, and a duty cycle correction method applied to the DLL is required for ensuring a sufficient design margin of the duty cycle.

FIG. 1 shows a prior art duty cycle correction circuit 10 disclosed in U.S. Pat. No. 8,106,697. The duty cycle correction circuit 10 comprises a duty cycle detector 11, a filter 12, an operational amplifier 13, a charge pump 14, a control circuit 15, and a duty cycle corrector 16. The duty cycle detector 11 receives a pair of internal clock signals CK and CKB and generates a pair of control signals DCF and DCFB. The filter 12 obtains average voltages of the pair of control signals DCF and DCFB. The amplifier 13 compares output voltages of the filter 12 and generates an enable signal EN. The control circuit 15 receives the enable signal EN and generates two switch enable signals ENCPS and ENCPL. The charge pump 14 receives the enable signals EN, ENCPS, and ENCPL and generates a pair of control signals DCC, DCCB. The duty cycle corrector 16 receives a pair of external clock signals ECK and ECKB, the two pairs of control signals DCF, DCFB, DCC, and DCCB and generates the pair of the internal clock signals CK and CKB with a corrected duty cycle of about 50%.

Referring to FIG. 1, the duty cycle correction circuit 10 requires the charge pump 14 to obtain the pair of control signals DCC, DCCB so as to correct the duty cycle of the external clock signals ECK and ECKB. However, the charge pump 14 has a speed limitation on the maximum operation frequency, which results in long duty cycle correction time. In addition, the duty cycle correction circuit 10 lacks a means of tracking the frequency variation of the input clock signal. Therefore, it may not be operated over a wide range of input frequencies.

Accordingly, there is a need to provide a circuit to solve the above problems.

SUMMARY OF THE INVENTION

One aspect of the present invention is to provide a duty cycle correction circuit without the problems or disadvantages that exist in the prior art.

According to one embodiment of the present invention, the duty cycle correction circuit comprises a duty cycle detector, a filter, a comparator, a successive approximation register digital to analog converter (SAR DAC), an equalization device, a pass gate circuit, and a duty cycle corrector. The duty cycle detector generates a pair of control signals in response to a pair of internal clock signals. The filter obtains average voltages of the pair of control signals. The comparator compares a pair of output signals from the filter to generate a comparison result. The SAR DAC performs a SAR algorithm to generate a pair of analog output signals based on the comparison result. The equalization device equalizes voltage levels of the pair of control signals. The pass gate circuit applies the pair of control signals to the duty cycle corrector if the pass gate circuit is enabled. The duty cycle corrector receives a pair of external clock signals, the pair of analog output signals, and a pair of output signals from the pass gate circuit to generate the pair of internal clock signals with a corrected duty cycle.

BRIEF DESCRIPTION OF THE DRAWINGS

The invention will be described according to the appended drawings in which.

Figure 7:
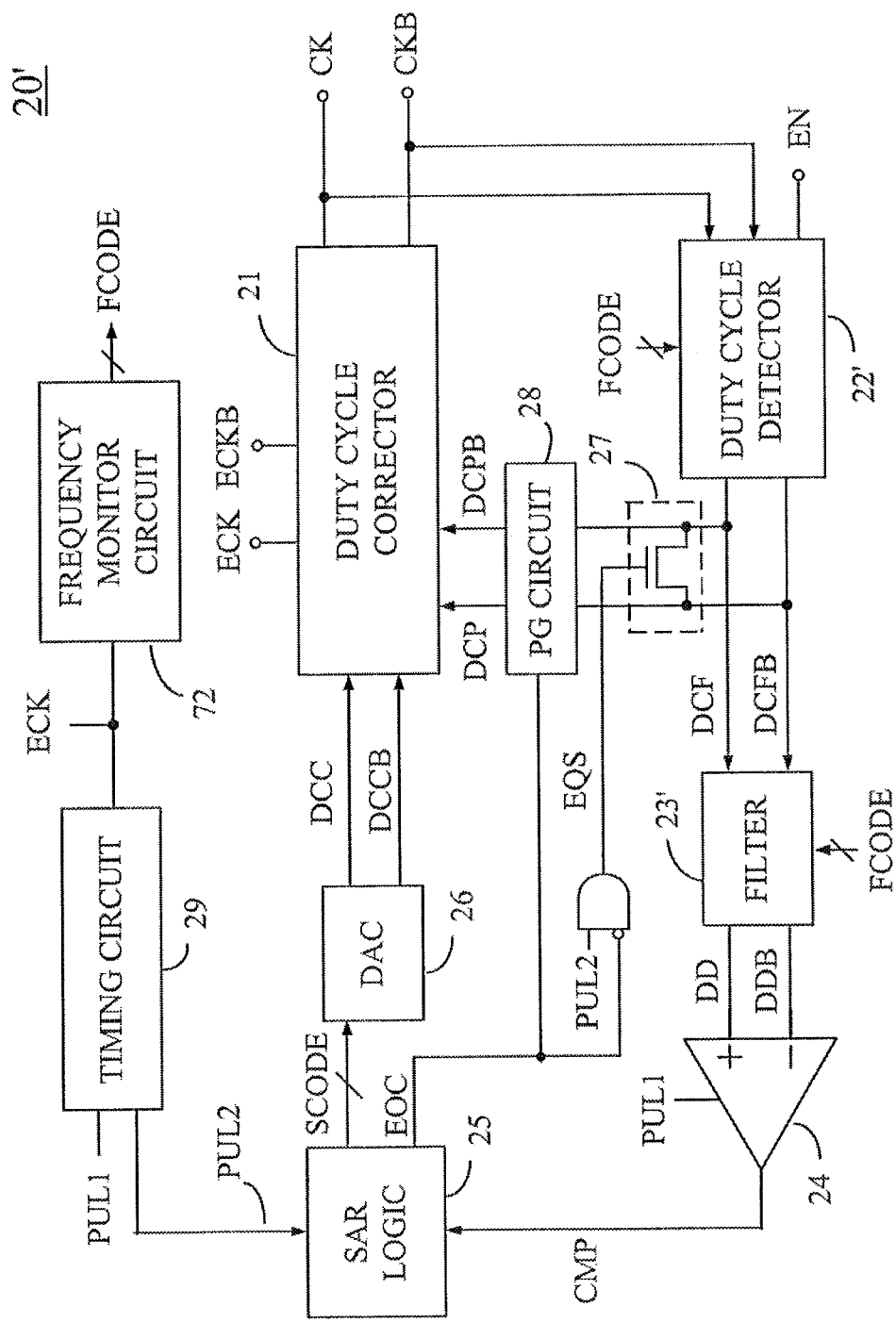
FIG. 7 shows a block diagram of a duty cycle correction circuit according to a second embodiment of the present invention.
Figure 11:
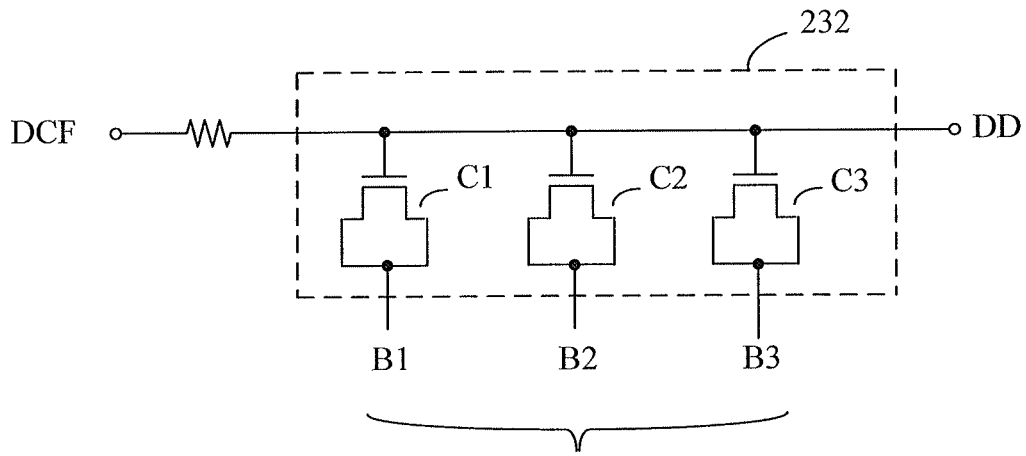
Figure 11:
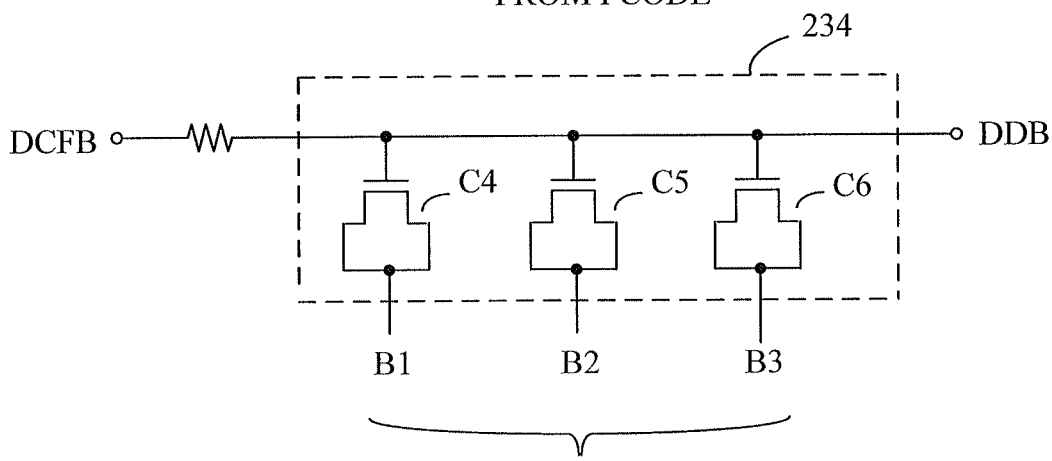
Figure 12:
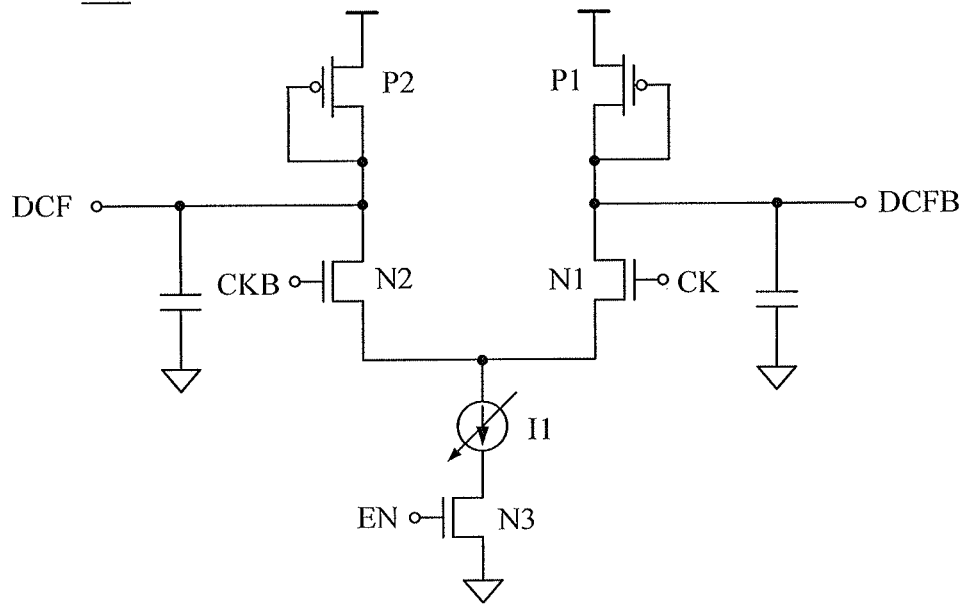
Figure 13:
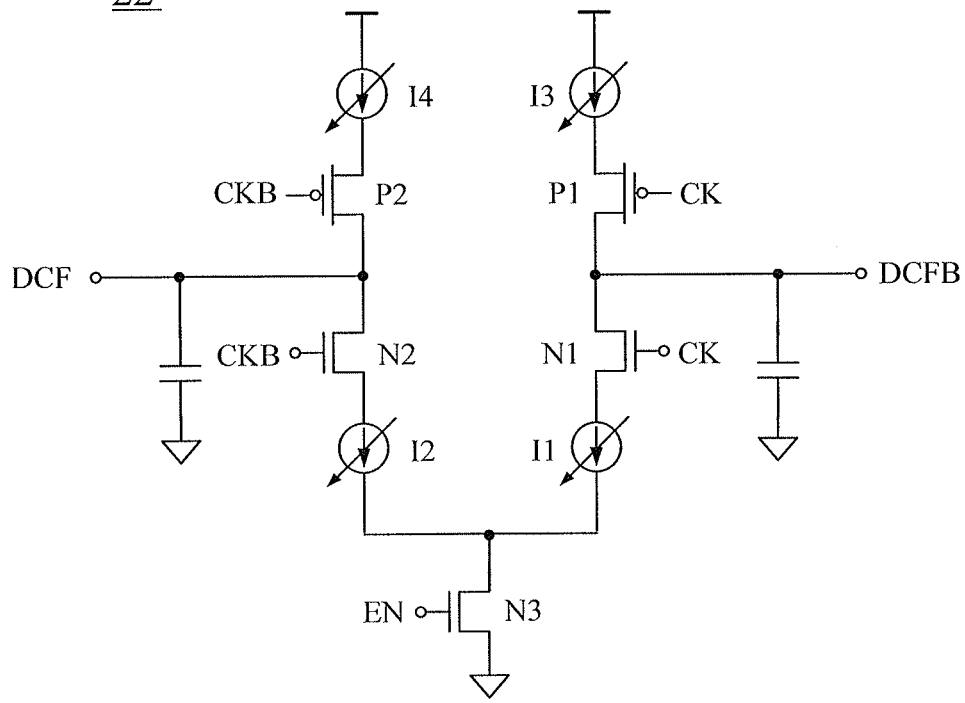

to FIG. 11 shows a circuit diagram of the filter according to the second embodiment of the present invention;

FIG. 12 shows a circuit diagram in accordance with the second embodiment of the duty cycle detector in FIG. 7; and FIG. 13 shows a circuit diagram in accordance with another embodiment of the duty cycle detector in FIG. 7.

DETAILED DESCRIPTION OF THE INVENTION

Figure 1:
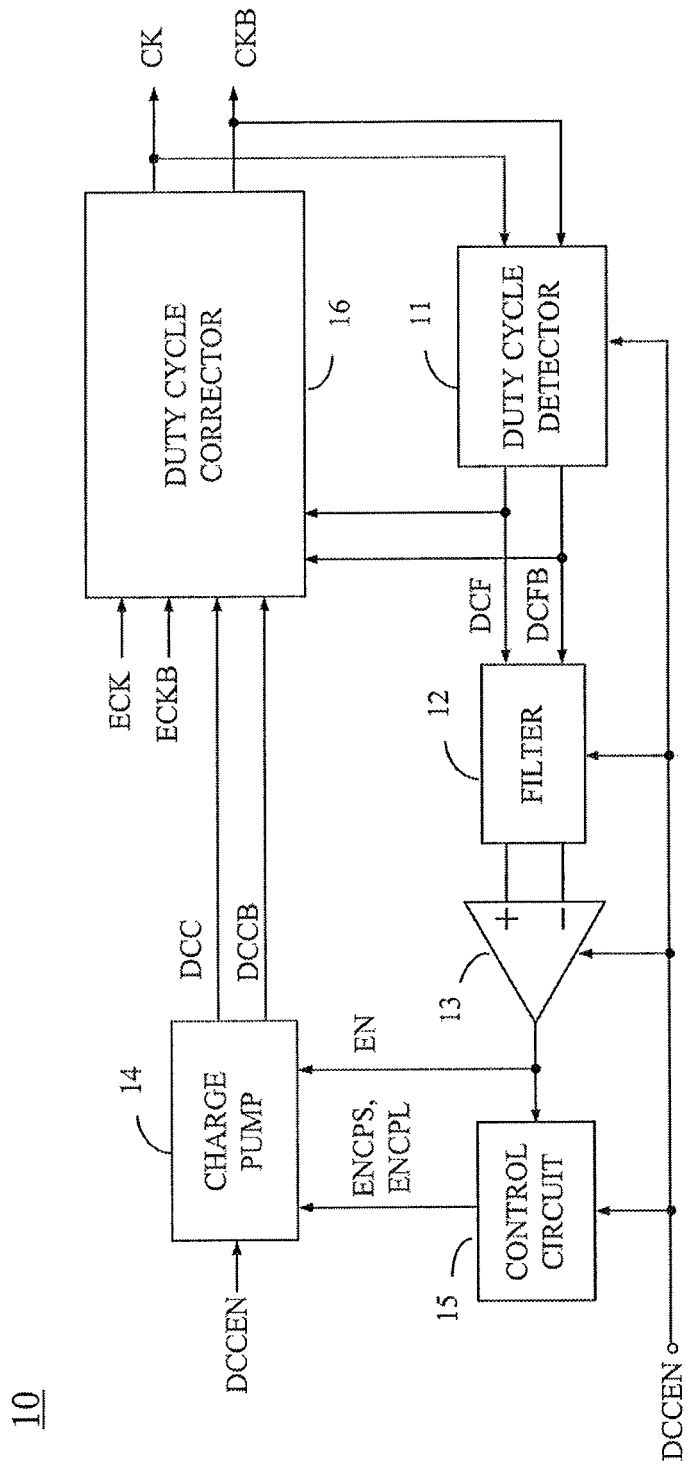
FIG. 1 shows a prior art duty cycle correction circuit disclosed in U.S. Pat. No. 8,106,697.
Figure 2:
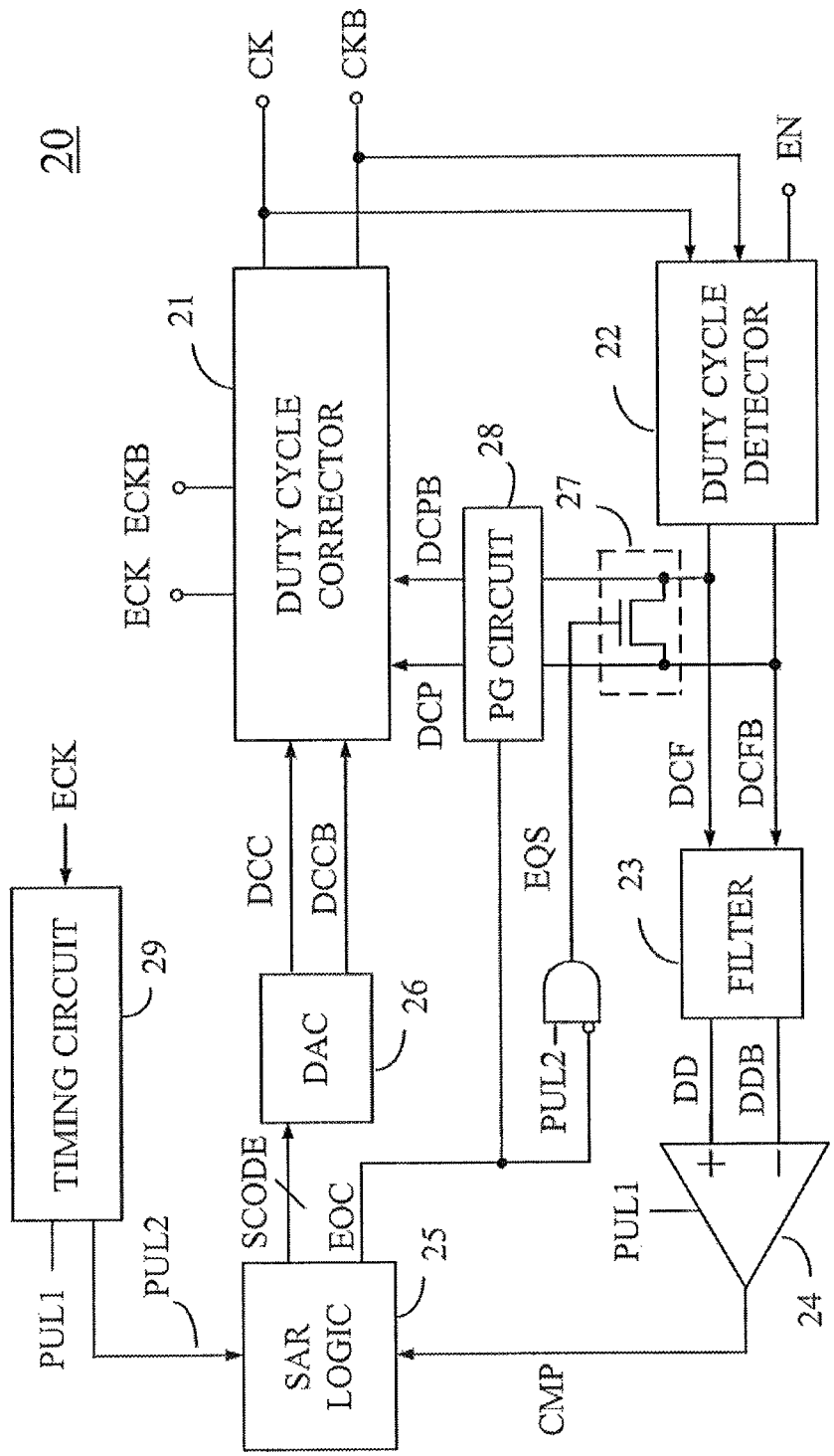
FIG. 2 shows a block diagram of a duty cycle correction circuit according to a first embodiment of the present invention.

FIG. 2 shows a block diagram of a duty cycle correction circuit 20 according to a first embodiment of the present invention. The duty cycle correction circuit 20 comprises a duty cycle corrector 21, a duty cycle detector 22, a filter 23, a comparator 24, a successive-approximation-register (SAR) logic 25, and a digital to analog converter (DAC) 26.

Referring to FIG. 2, the duty cycle corrector 21 generates a pair of internal clock signals CK and CKB in response to a pair of external clock signals ECK and ECKB, wherein the clock signal CKB is complementary to the clock signal CK and the clock signal ECKB is complementary to the clock signal ECK. The duty cycle detector 22 generates a pair of control signals DCF and DCFB based on the duty cycle of the pair of internal clock signals CK and CKB, wherein the control signal DCFB is complementary to the control signal DCF. The filter 23 filters the pair of control signals DCF and DCFB to obtain a pair of average signals DD and DDB, wherein the signal DDB is complementary to the signal DD.

After receiving the average signals DD and DDB from the filter 23, the comparator 24 generates a comparison signal CMP, which controls the SAR logic 25 to generate a digital code SCODE. Thereafter, the DAC 26 receives the digital code SCODE to generate corresponding analog output signals DCC and DCCB, wherein the output signal DCCB is complementary to the output signal DCC.

Referring to FIG. 2, the duty cycle correction circuit 20 further comprises an equalization device 27 and a pass gate (PG) circuit 28. The equalization device 27 equalizes voltage levels of the pair of control signals DCF and DCFB in response to a signal EQS. The PG circuit 28 is electrically coupled between the equalization device 27 and the duty cycle corrector 21. The PG circuit 28 applies the pair of control signals DCP and DCPB to the duty cycle corrector 21 in response to a signal EOC.

Figure 3:
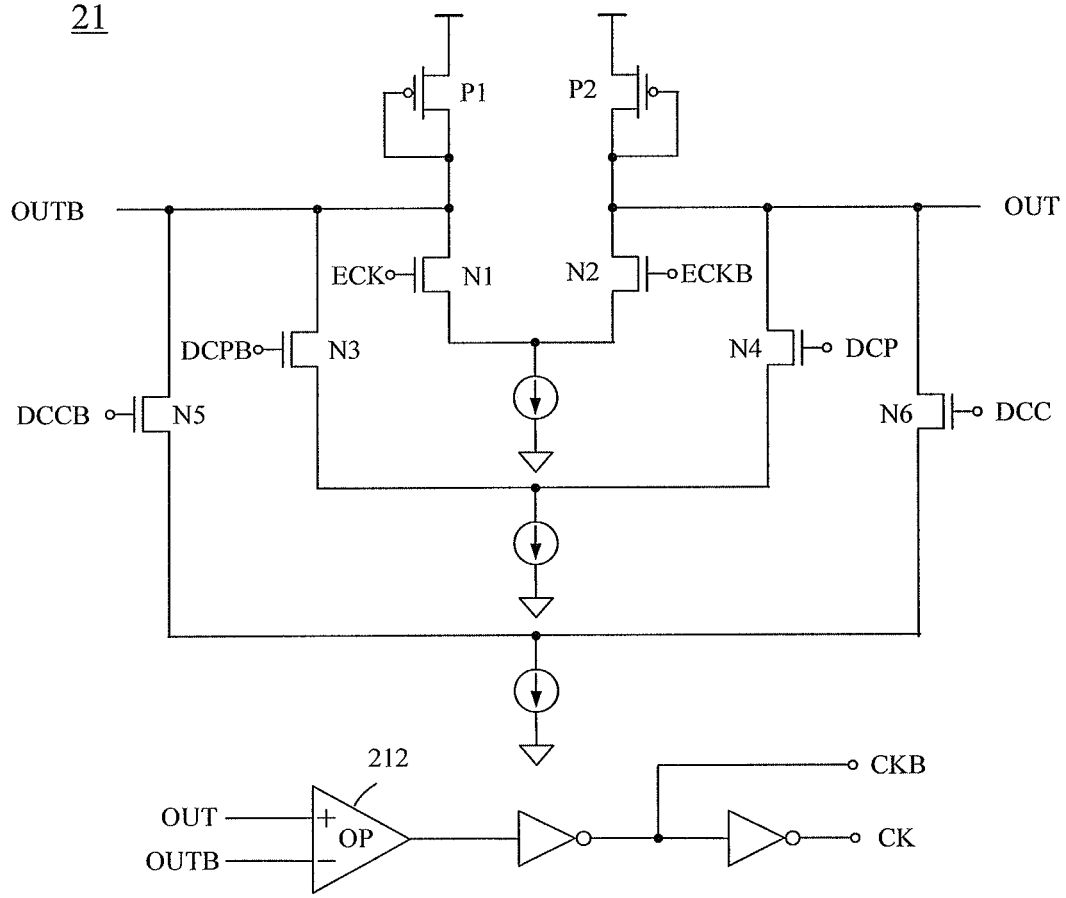
FIG. 3 shows a circuit diagram in accordance with the first embodiment of the duty cycle corrector in FIG. 2.

Referring to FIG. 2, the duty cycle corrector 21 receives the pair of external clock signals ECK and ECKB, the pair of analog output signals DCC and DCCB, and a pair of output signals DCP and DCPB from the pass gate circuit 28 to adjust the duty cycle of the pair of internal clock signals CK and CKB to a corrected duty cycle. FIG. 3 shows a circuit diagram in accordance with one embodiment of the duty cycle corrector 21 in FIG. 2, wherein the duty cycle corrector 21 is represented as a differential amplifier with multi-input pairs in this embodiment. Referring to FIG. 3, the duty cycle corrector 21 comprises a first input pair including NMOS transistors N1 and N2 for receiving the pair of external clock signals ECK and ECKB, a second input pair including NMOS transistors N3 and N4 for receiving the pair of signals DCP and DCPB as fine tuning control signals, and a third input pair including NMOS transistors N5 and N6 for receiving the pair of analog output signals DCC and DCCB as coarse tuning control signals. The first, second, and third input pairs are all connected to diode-connected loads composed of PMOS transistors P1 and P2. The output signals OUT and OUTB of the multi-input differential amplifier are outputted to an amplifier 212 for generating the pair of internal clock signals CK and $CK_B$ with the corrected duty cycle of about 50%.

Figure 4:
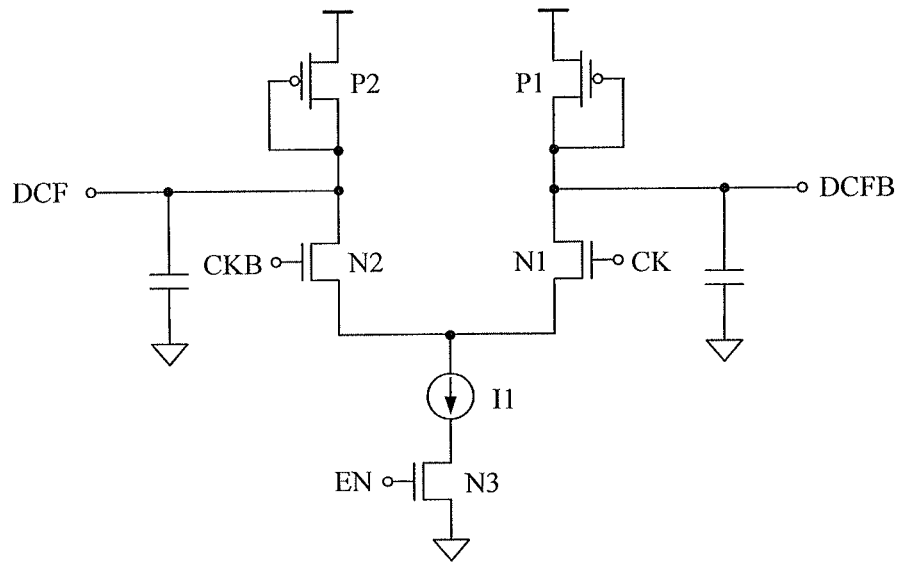
FIG. 4 shows a circuit diagram in accordance with the first embodiment of the duty cycle detector in FIG. 2.

FIG. 4 shows a circuit diagram in accordance with one embodiment of the duty cycle detector 22 in FIG. 2, wherein the duty cycle detector 22 is represented as a differential amplifier in this embodiment. Referring to FIG. 4, the duty cycle detector 22 comprises an input pair including NMOS transistors N1 and N2 for receiving the pair of internal clock signals CK and CKB. The input pair is connected to diode-connected loads composed of PMOS transistors P1 and P2. An increase in the amount of the voltage difference between the output signals of the duty cycle detector 22 is determined based on the duty cycle of the pair of internal clock signals CK and CKB.

Figure 5:
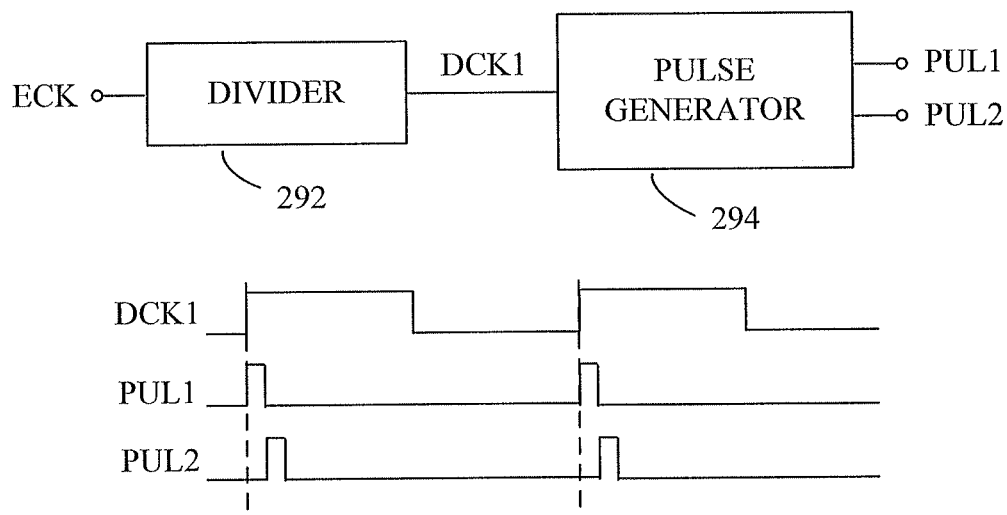
FIG. 5 shows a detailed block diagram in accordance with the first embodiment of the timing circuit in FIG. 2.

Referring now to FIG. 2, the duty cycle correction circuit 20 further comprises a timing circuit 29. The comparator 24, the SAR logic 25, and the pass gate circuit 27 are all operated under the control of timing signals PUL1 and PUL2 from the timing circuit 29. FIG. 5 shows a detailed block diagram in accordance with one embodiment of the timing circuit 29 in FIG. 2. Referring to FIG. 5, the timing circuit 29 comprises a divider 292 and a pulse generator 294. The divider 292 divides the frequency of the external clock signal ECK and outputs a divided clock signal DCK1. The pulse generator 294 generates two non-overlapping pulse signals PUL1 and PUL2, each having a plurality of pulses in response to the divided clock signal DCK1, wherein the trailing edges of the phase signal PUL1 are substantially coincident with the leading edges of the phase signal PUL2. Referring to FIG. 2, since the frequency of the clock signal ECK is higher than that of the divided clock signal DCK1, the current consumption of the comparator 24 and the SAR logic 25 can be reduced. In addition, the lower frequency of the divided clock signal DCK1 can improve the loop stability of the duty cycle correction circuit 20 and reduce jitter.

Figure 6:
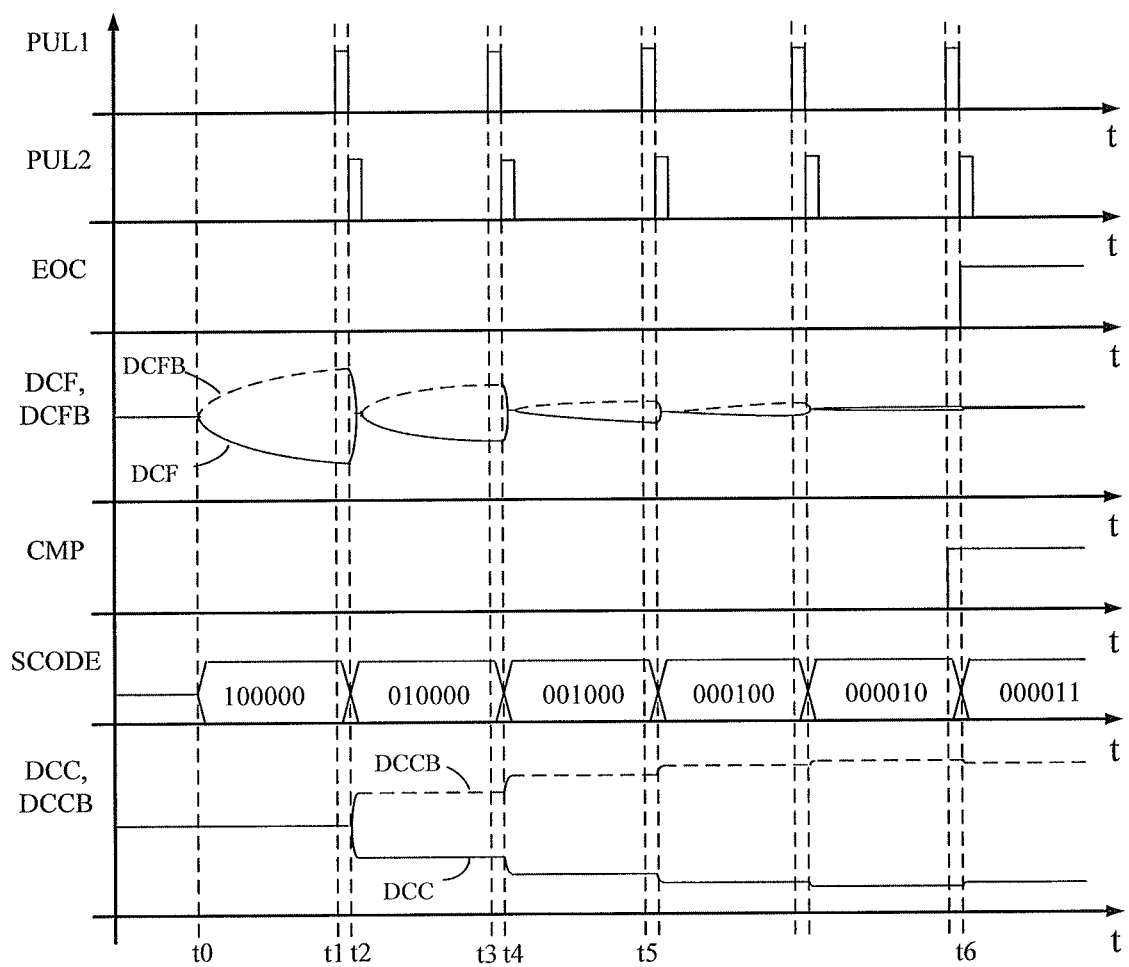
FIG. 6 is a waveform diagram showing the operation of the duty cycle correction circuit according to the first embodiment of the present invention.

The present invention will now be discussed in detail with respect to FIG. 2 and FIG. 6. FIG. 6 is a waveform diagram showing the operation of the duty cycle correction circuit 20 according to at least the first embodiment of the present invention. In this embodiment, the duty ratio of the external clock signal ECK is much smaller than 50%, e.g. 35% and the frequency of the pulse signal PUL1 is one-sixteenth of that of the external clock signal ECK.

Referring to FIG. 6, the SAR logic 25 in FIG. 2 is initialized and the digital code SCODE of the SAR logic 25 are set to [100000] at time t0. Upon receiving the digital code SCODE [100000], the DAC 26 generates a pair of analog signals DCC and DCCB whose values are equal to a middle reference voltage ½VRMID. The analog signals DCC and DCCB are sent to the duty cycle corrector 21. Since the initial duty cycle of the internal clock signal CK is much smaller than the desired duty cycle, the control signal DCF decreases rapidly as the complementary control signal DCFB increases rapidly. The pair of control signals DCF and DCFB are filtered by the filter 23 and then are fed into the comparator 24.

At time t1, the first pulse of the pulse signal PUL1 is generated, thereby causing the comparator 24 to output the comparison result based on the voltage difference between the average signals DD and DDB. Thereafter, the first pulse of the pulse signal PUL2 is generated at time t2, so that the signal EQS is activated to a logic high level. This causes the equalization device 27 to equalize the voltage levels of the pair of control signals DCF and DCFB. Referring to FIG. 6, since the equalization device 27 equalizes the voltage levels of the pair of control signals DCF and DCFB during each pulse of the pulse signal PUL2, the voltage levels of the control signals DCF and DCFB start at the middle reference voltage ½VRMID after the pulse of the signal PUL2. In this manner, the loop response time of the duty cycle correction circuit 20 can be improved.

Referring to FIG. 2, since the filter 23 requires time to obtain the average signals DD and DDB, an additional equalization device (not shown) can be disposed between the output terminals of the filter 23 in another embodiment of the present invention. Therefore, the voltage levels of the average signals DD and DDB can be equalized in response to the pulse of the signal EQS regardless of the response time of the filter 23.

The SAR logic 25 uses the comparison result of the comparator 24 to determine the corresponding bit in the digital bits in each conversion cycle. Since the comparator 24 outputs a logic low level or a "0" at time t1, the SAR logic 25 clears the highest bit and set the digital code SCODE to [010000] at time t2. Upon receiving the digital code SCODE= [010000], the DAC 26 generates the signal DCC whose value is equal to ¼VRMID and the complementary signal DCCB whose value is equal to ¾VRMID.

Since the voltage difference of the pair of signals DCC and DCCB increase in contrast to the previous state, the duty cycle corrector 21 outputs the clock signal CK with an increased duty cycle. The duty cycle detector 22 generates the signals DCF and DCFB corresponding to the duty cycle of the clocks signal CK. Therefore, the voltage difference between the signals DCF and DCFB during time t2 to t3 is less than the voltage difference between the signals DCF and DCFB during time t1 to t2.

At time t3, the second pulse of the pulse signal PUL1 is generated, thereby causing the comparator 24 to output the comparison result. Since the average voltage of the signal DCF is less than that of the signal DCFB, the comparator 24 outputs a logic low level or a "0". The SAR logic 25 sets the digital code SCODE to [001000] based on the comparison result and the DAC 26 generates corresponding analog outputs DCC and DCCB at time t4. Meanwhile, the equalization device 27 equalizes the voltage levels of the pair of control signals DCF and DCFB.

At time t5, as the voltage difference of the pair of signals DCC and DCCB increase, the duty cycle corrector 21 outputs the clock signal CK with an increased duty cycle, thereby reducing the voltage difference between the voltage difference of the pair of signals DCF and DCFB. The SAR conversion process is repeated until all bits of the digital code SCODE are determined.

Referring to FIG. 6, the SAR conversion process is ended at time t6, and the SAR logic 25 in FIG. 2 outputs the process end signal EOC to the pass gate circuit 28. Therefore, the pair of signals DCF and DCFB are applied to the duty cycle corrector 21 through the pass gate circuit 28 as fine tuning control signals in response to the end signal EOC. After time t6, the duty cycle of the internal clock signal CK is adjusted to the corrected duty cycle of about 50%, as well as the complementary clock signal CKB. The duty cycle detector 22 detects variations in the duty cycle of the clock signal CK after time t6, and generates the pair of signals DCF and DCFB to the duty cycle corrector 21 through the pass gate circuit 28 as fine tuning control signals so as to correct the variations in the duty cycle of the clock signal ECK.

According to another preferred embodiment, the duty cycle correction circuit 20' further comprises a frequency monitor circuit 72 as shown in FIG. 7. By monitoring the frequency variation of the clock signal ECK, the duty cycle correction circuit 20' can operate over a wide range of input frequencies. Referring to FIG. 7, the frequency monitor circuit 72 monitors the frequency of the clock signal ECK to generates a digital code FCODE that indicate whether the clock signal ECK is a high frequency clock or a low frequency clock. For example, if the duty cycle correction circuit 20 operates at the highest clock speed (e.g., 555 MHz), the frequency monitor circuit 72 may generate the code FCODE=[111], and if the duty cycle correction circuit 20 operates at the lowest clock speed (e.g., 143 MHz), the frequency monitor circuit 72 may generate the code FCODE=[000]. Thereafter, the digital code FCODE is sent to the filter 23' so as to control its response time.

Figure 8:
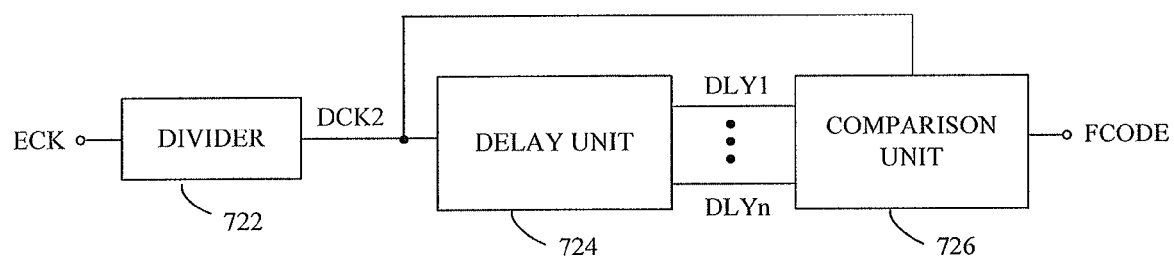
FIG. 8 shows a detailed block diagram of the frequency monitor circuit according to the second embodiment of the present invention.

FIG. 8 shows a detailed block diagram of the frequency monitor circuit 72 according to at least the second embodiment of the present invention. Referring to FIG. 8, the frequency monitor circuit 72 comprises a divider 722, a delay unit 724, and a comparison unit 726. The frequency divider 722 divides the frequency of the external clock signal ECK and outputs a divided clock signal DCK2. The delay unit 724 comprises a plurality of delay circuits, each of which delays the divided clock signal DCK2 by a corresponding time. The comparison unit 726 comprising a plurality of comparison circuits compares the divided clock signal DCK2 with the delayed signals from the delay unit 724 and generates the digital code FCODE representative of frequency distribution.

Figure 9:
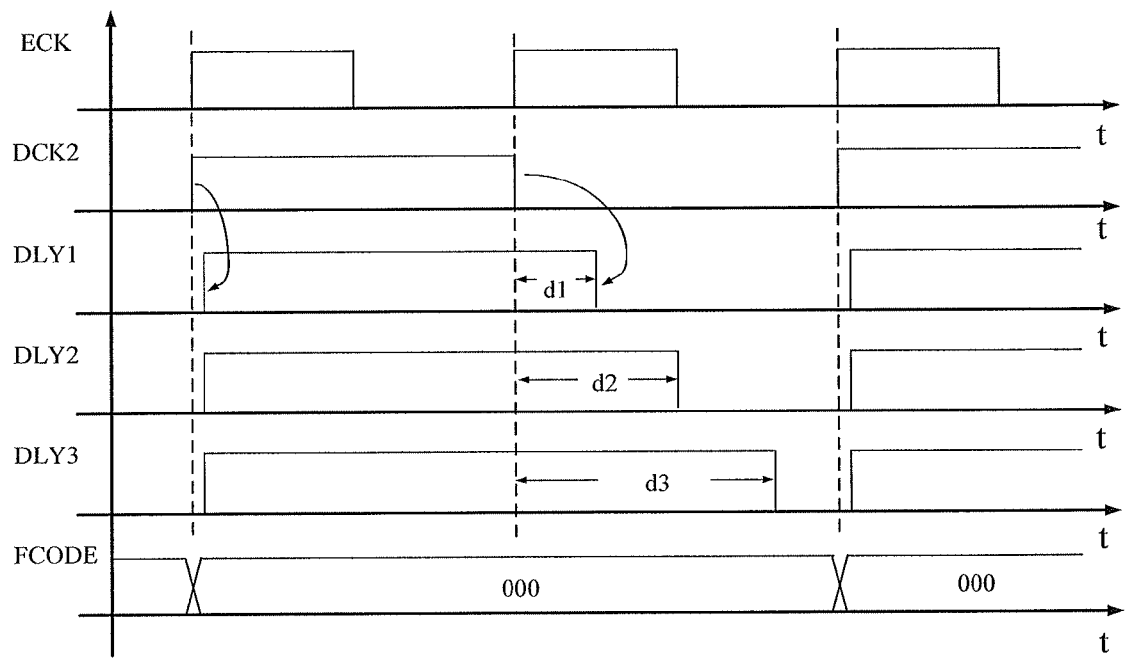
FIG. 9 is an operation waveform of the frequency monitor circuit of FIG. 7 in a case in which the clock speed of the external clock signal ECK is about 125 MHz.
Figure 10:
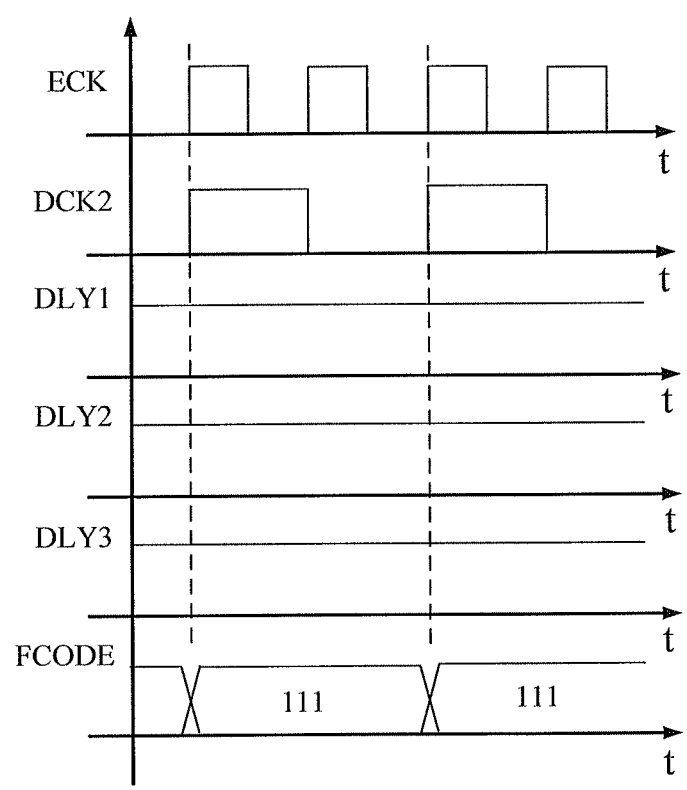
FIG. 10 is an operation waveform of the frequency monitor circuit of FIG. 7 in a case in which the clock speed of the external clock signal ECK is about 555 MHz.

FIG. 9 is an operation waveform of the frequency monitor circuit 72 of FIG. 7 in the case in which the clock speed of the external clock signal ECK is about 125 MHz. FIG. 10 is an operation waveform of the frequency monitor circuit 72 of FIG. 7 in the case in which the clock speed of the external clock signal ECK is about 555 MHz. Referring to FIG. 7, the frequency divider 722 in this embodiment is a frequency divide-by-2 circuit. Therefore, the frequency divider 722 generates the clock divided signal DCK2 that are two times the period of the input clock signal ECK.

Referring to FIG. 9 and FIG. 10, the delay unit 724 receives the divided clock signal DCK2 and generates a plurality of delayed signals DLY1, DLY2, and DLY3. Since the delay d1 between falling edges of the signal DCK2 and falling edges of the signal DLY1 is about 1.8 ns, the delay d2 between falling edges of the signal DCK2 and falling edges of the signal DLY2 is about 4.5 ns, and the delay d3 between falling edges of the signal DCK2 and falling edges of the signal DLY3 is about 7 ns, respectively, the input clock period of less than 1.8 ns, between 1.8 ns and 4.5 ns, between 4.5 ns and 7 ns, and more than 7 ns can be detected through the frequency monitor circuit 72. More specifically, when the frequency of the external clock signal ECK is faster than 555 MHz, the frequency monitor circuit 72 generates the code FCODE=[111], when the frequency of the external clock signal ECK is between 222 MHz and 555 MHz, the frequency monitor circuit 72 generates the code FCODE=[011], when the frequency of the external clock signal ECK is between 143 MHz and 222 MHz, the frequency monitor circuit 72 generates the code FCODE=[001], and when the frequency of the external clock signal ECK is slower than 143 MHz, the frequency monitor circuit 72 generates the code FCODE=[000].

Referring to FIG. 7, the filter 23' in this embodiment is a frequency controlled filter. In other words, the response time of the filter 23' can be determined based on the frequency value. FIG. 11 shows a circuit diagram of the filter 23' according to one embodiment of the present invention. Referring to FIG. 11, the filter 23' comprises capacitor arrays 232 and 234, each providing a variable capacitance based on the code FCODE.

The capacitor array 232 in FIG. 11 comprises a plurality of MOS capacitors C1, C2, and C3. Each MOS capacitor is implemented by a NMOS transistor with the gate terminal connected to the output voltage DD and with the drain terminal shorted with the source terminal and connected to the corresponding bit in the code FCODE. The capacitor array 234 has the same structure and function, and thus a detailed description thereof will be omitted.

Referring to FIG. 11, the minimum capacitance value of the capacitor array 232 is provided when [B1 B2 B3]=[1 1 1], while the maximum capacitance value of the capacitor array 232 is provided when [B1 B2 B3]=[0 0 0]. In one preferred embodiment, the capacitance values of the capacitor arrays 232 and 234 are smaller when the clock signal ECK is fast, thereby reducing the response time of the filter 23'.

In another embodiment of the present invention, the gain of the duty cycle detector 22' shown in FIG. 7 can be adjusted based on the frequency value. FIG. 12 shows a circuit diagram in accordance with one embodiment of the duty cycle detector 22' in FIG. 7. Referring to FIG. 12, the current I1 flowing through the input pair is varied based on the code FCODE from the frequency monitor circuit 72. More specifically, the magnitude of the current I1 is increased at higher frequencies, thereby increasing the gain of the duty cycle detector 22'.

FIG. 13 shows a circuit diagram in accordance with another embodiment of the duty cycle detector 22' in FIG. 7. Referring to FIG. 13, the duty cycle detector 22" comprises a first input pair including NMOS transistors N1 and N2 for receiving the pair of internal clock signals CK and CKB. The first input pair is connected to a second input pair including PMOS transistors P1 and P2 for receiving the pair of internal clock signals CK and CKB. A bias current I1 flows through the NMOS transistors N1, a bias current I2 flows through the NMOS transistors N2, a bias current I3 flows through the PMOS transistors P1, and a bias current I4 flows through the PMOS transistors P2.

In this embodiment, the bias currents I1, I2, I3, and I4 have the same order of magnitude and are controlled by the code FCODE from the frequency monitor circuit 72. More specifically, the magnitude of the bias currents I1, I2, I3, and I4 are increased at higher frequencies, thereby increasing the gain of the duty cycle detector 22'. In this manner, the overall loop response time of the duty cycle correction circuit 20' can be improved at higher frequencies.

The above-described embodiments of the present invention are intended to be illustrative only. Numerous alternative embodiments may be devised by those skilled in the art without departing from the scope of the following claims.

What is claimed is:

1. A duty cycle correction circuit, comprising:
   a duty cycle detector configured to generate a pair of control signals in response to a pair of internal clock signals;
   a filter configured to obtain average voltages of the pair of control signals;
   a comparator configured to compare a pair of output signals from the filter to generate a comparison result;
   a successive approximation register digital to analog converter (SAR DAC) configured to perform a SAR algorithm to generate a pair of analog output signals based on the comparison result;
   a first equalization device configured to equalize voltage levels of the pair of control signals;
   a pass gate circuit configured to apply the pair of control signals to a duty cycle corrector if the pass gate circuit is enabled; and
   a duty cycle corrector configured to receive a pair of external clock signals, the pair of analog output signals, and a pair of output signals from the pass gate circuit to generate the pair of internal clock signals with a corrected duty cycle.

2. The duty cycle correction circuit of claim 1, wherein the duty cycle correction circuit further comprises a second equalization device configured to equalize voltage levels of the pair of output signals from the filter.

3. The duty cycle correction circuit of claim 1, wherein the duty cycle corrector comprises:
   a first input pair coupled to a pair of output signals and configured to receive the pair of external clock signals;
   a second input pair coupled to the pair of output signals and configured to receive the pair of analog output signals;
   a third input pair coupled to the pair of output signals and configured to receive the pair of output signals from the pass gate circuit; and
   an amplifier configured to receive the pair of output signals to generate the pair of internal clock signals with the corrected duty cycle.

4. The duty cycle correction circuit of claim 1, wherein the duty cycle detector comprises:
   diode-connected loads; and
   an input pair coupled to the diode-connected loads and configured to receive the pair of internal clock signals to generate the pair of control signals.

5. The duty cycle correction circuit of claim 1, further comprising:
   a divider configured to divide the frequency of one of the pair of external clock signals to generate a divided clock signal; and
   a pulse generator configured to generate first and second pulse signals in response to the divided clock signal;
   wherein pulses of the first and second pulse signals are non-overlapping, and rising edges of the first pulse signal lead rising edges of the second pulse signal.

6. The duty cycle correction circuit of claim 5, wherein the comparator generates the comparison result in response to the pulses of the first pulse signals.

7. The duty cycle correction circuit of claim 5, wherein the SAR DAC performs the SAR algorithm in response to the pulses of the second pulse signals.

8. The duty cycle correction circuit of claim 5, wherein the equalization device equalizes the voltage levels of the pair of control signals in response to the pulses of the second pulse signals.

9. The duty cycle correction circuit of claim 5, wherein the pass gate circuit is enabled when the SAR DAC completes the SAR algorithm.

10. The duty cycle correction circuit of claim 1, further comprising a frequency monitor circuit configured to generate a monitor signal indicative of frequencies of the pair of the external clock signals.

11. The duty cycle correction circuit of claim 10, wherein response time of the filter is controlled by the monitor signal.

12. The duty cycle correction circuit of claim 10, wherein the filter comprises a capacitor array for providing a variable capacitance based on the monitor signal.

13. The duty cycle correction circuit of claim 10, wherein the duty cycle detector comprises:
   diode-connected loads;
   an input pair coupled to the diode-connected loads and configured to receive the pair of the internal clock signals to generate the pair of control signals; and
   a bias current coupled to the input pair;
   wherein magnitude of the bias current is controlled by the monitor signal.

14. The duty cycle correction circuit of claim 10, wherein the duty cycle detector comprises:
   a first input pair comprising first and second transistors for receiving the pair of internal clock signals;
   a second input pair comprising third and fourth transistors for receiving the pair of internal clock signals, the second input pair coupled to the first input pair;
   a first bias current coupled to the first transistor;
   a second bias current coupled to the second transistor;
   a third bias current coupled to the third transistor; and
   a fourth bias current coupled to the fourth transistor;
   wherein the first, second, third, fourth bias currents have the same order of magnitude and are controlled by the monitor signal.

* * * * *